US011156646B2

(12) United States Patent
Berger et al.

(10) Patent No.: US 11,156,646 B2
(45) Date of Patent: Oct. 26, 2021

(54) METHOD FOR AGGREGATING OPERATING VALUES OF A PLURALITY OF SPATIALLY DISTRIBUTED OPERATING UNITS, AND MONITORING DEVICE FOR CARRYING OUT THE METHOD

(71) Applicant: Bayerische Motoren Werke Aktiengesellschaft, Munich (DE)

(72) Inventors: Jens Berger, Munich (DE); Guercan Guelesir, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 154 days.

(21) Appl. No.: 16/570,513

(22) Filed: Sep. 13, 2019

(65) Prior Publication Data
US 2020/0003810 A1 Jan. 2, 2020

Related U.S. Application Data

(63) Continuation of application No. PCT/EP2018/052598, filed on Feb. 2, 2018.

(30) Foreign Application Priority Data

Mar. 14, 2017 (DE) ..................... 10 2017 204 176.5

(51) Int. Cl.
*G01R 21/133* (2006.01)
*G01R 19/25* (2006.01)

(52) U.S. Cl.
CPC ....... *G01R 21/133* (2013.01); *G01R 19/2513* (2013.01)

(58) Field of Classification Search
CPC .. G01R 21/133; G01R 21/00; G01R 19/2513; G01R 19/25; G01R 19/00; G06Q 50/06; G06Q 50/00; G06Q 10/04
See application file for complete search history.

(56) References Cited

U.S. PATENT DOCUMENTS 7,243,044 B2 7/2007 McCalla
2002/0052712 A1* 5/2002 Voser ................. G05B 23/0254
702/182

(Continued)

FOREIGN PATENT DOCUMENTS

WO WO 2015/079554 A1 6/2015
WO WO 2016/130934 A1 8/2016

OTHER PUBLICATIONS

PCT/EP2018/052598, International Search Report dated Mar. 29, 2018 (Three (3) pages).

(Continued)

*Primary Examiner* — Mohamed Charioui
(74) *Attorney, Agent, or Firm* — Crowell & Moring LLP

(57) ABSTRACT

A method for aggregating operating values of a plurality of spatially distributed operating units, wherein aggregation times are predefined and the operating values of each operating unit describe an operating variable at each of the respective aggregation times, and a respective aggregation value is generated from time-synchronized operating values of the operating units for the aggregation. Respective raw values are received for each of the operating units, which describe the operating variable at a respective detection time, and the operating values of at least one of the operating units are formed based on the raw values thereof. For each of the aggregation times, and based on a predetermined checking function, a respective operating value is sought which fulfills a synchronization criterion and a plausibility criterion. If an operating value of this type is found it is used, and if no such operating value is found, a detection gap is signaled.

17 Claims, 8 Drawing Sheets

(56) References Cited

U.S. PATENT DOCUMENTS

| | | | |
|---|---|---|---|
| 2010/0023205 A1* | 1/2010 | Schmitt | B60W 50/045 |
| | | | 701/29.2 |
| 2011/0251933 A1 | 10/2011 | Egnor et al. | |
| 2012/0278038 A1 | 11/2012 | An et al. | |
| 2012/0290266 A1 | 11/2012 | Jain et al. | |
| 2013/0297242 A1 | 11/2013 | Bartmess et al. | |
| 2014/0067132 A1 | 3/2014 | Macek et al. | |
| 2014/0352396 A1* | 12/2014 | Rauh | G01P 21/00 |
| | | | 73/1.01 |
| 2015/0169795 A1 | 6/2015 | Eißat et al. | |
| 2015/0241488 A1 | 8/2015 | Sonderegger | |

OTHER PUBLICATIONS

German Search Report issued in German counterpart application No. 10 2017 204 176.5 dated Dec. 14, 2017, with Statement of Relevancy (Eight (8) pages).

Fowler et al., "Simplified Processing Method for Meter Data Analysis", Nov. 2015, URL: https://www.pnnl.gov/main/publications/external/technical_reports/PNNL-24331.pdf (Thirty Four (34) total pages).

Niyato et al., "Cooperative Transmission for Meter Data Collection in Smart Grid", IEEE Communications Magazine, Apr. 2012, vol., 50, No. 4 (Eight (8) total pages).

* cited by examiner

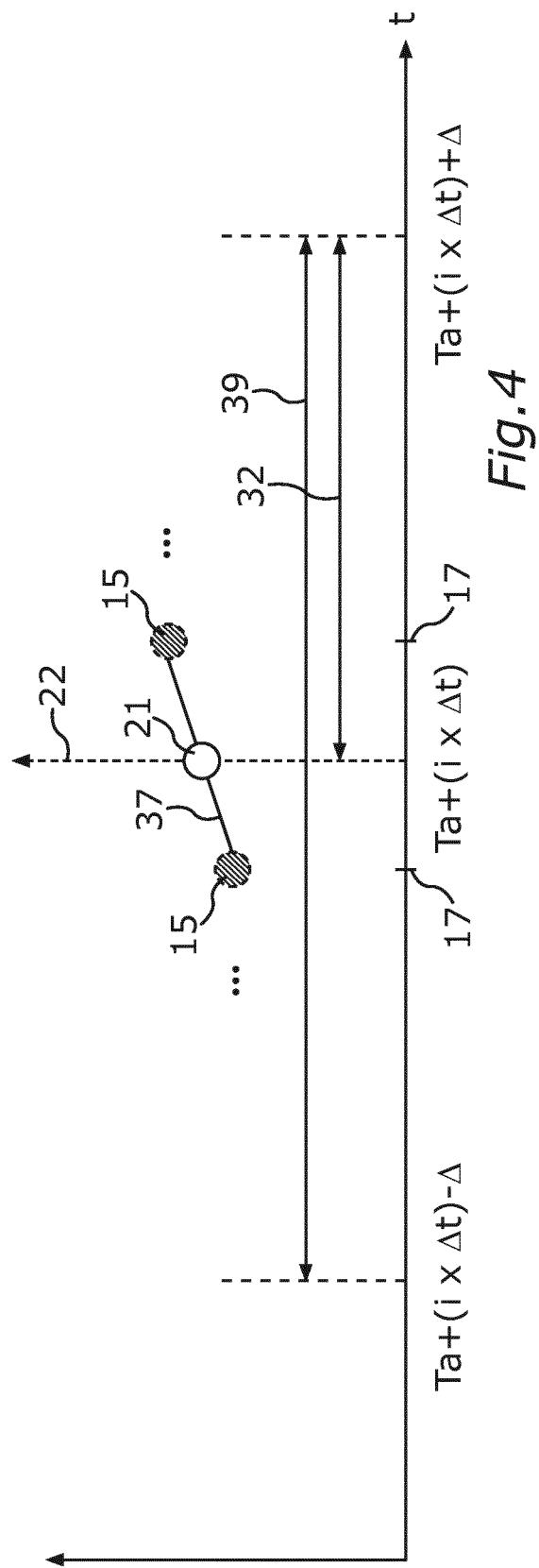

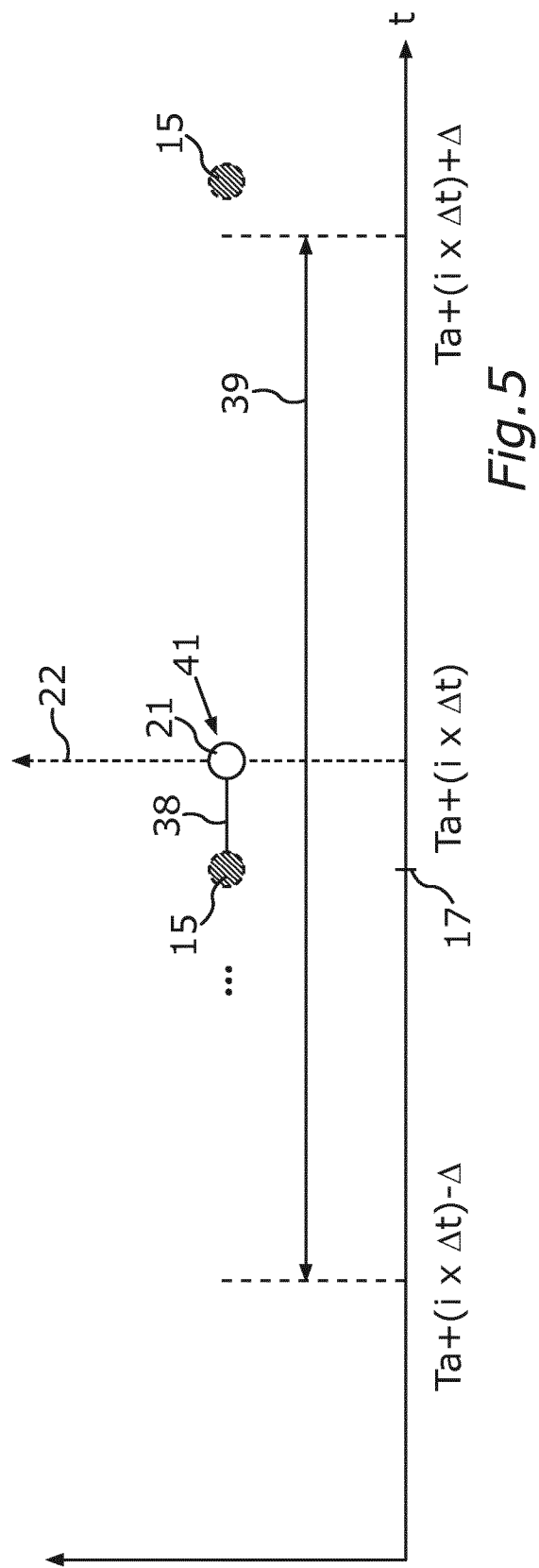

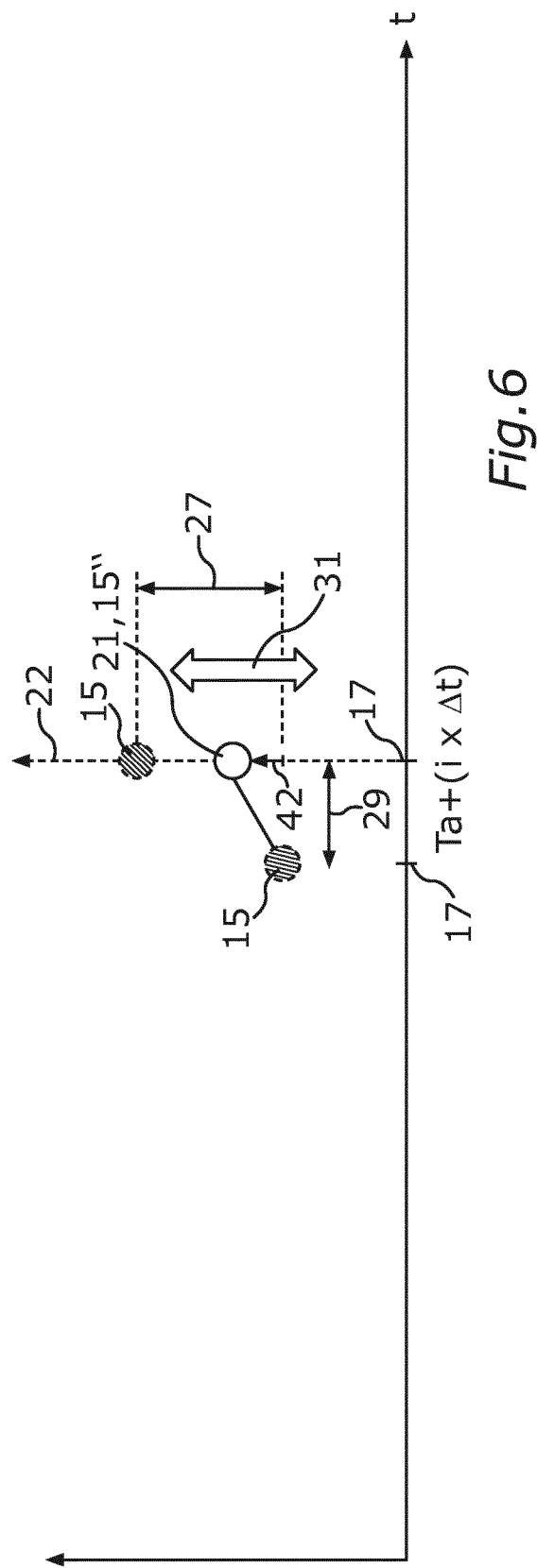

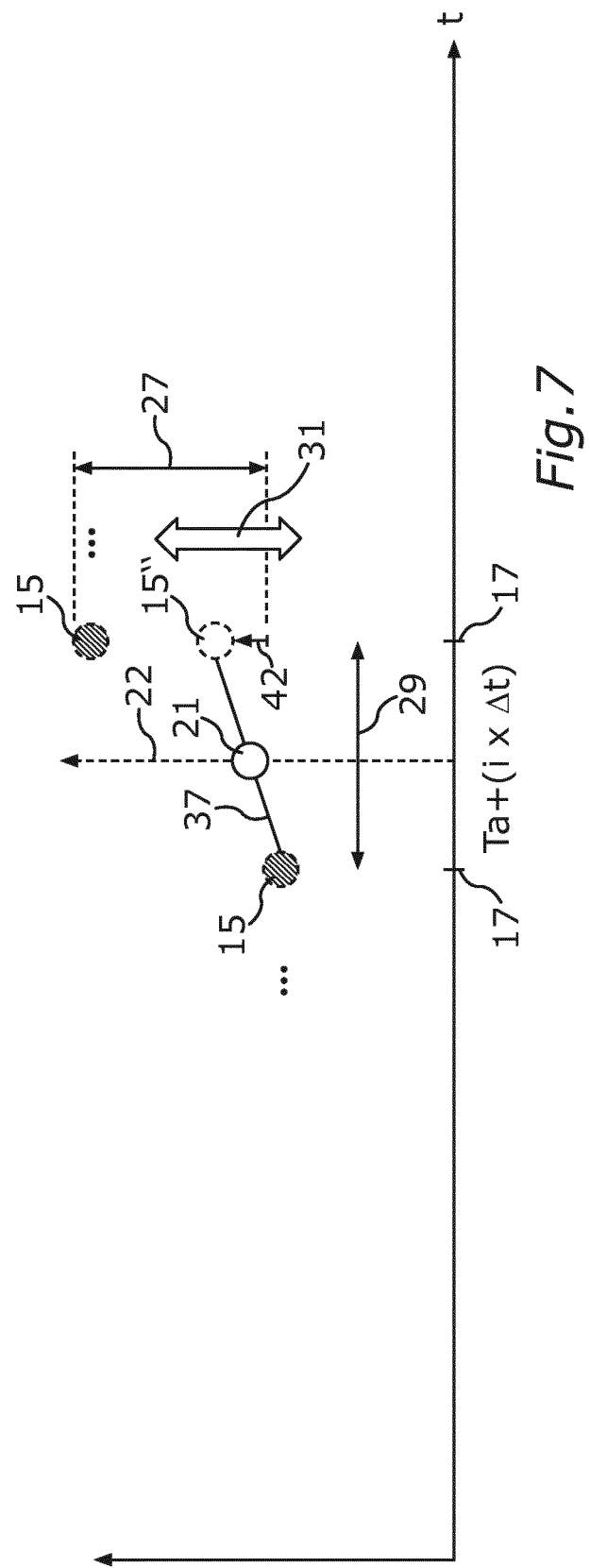

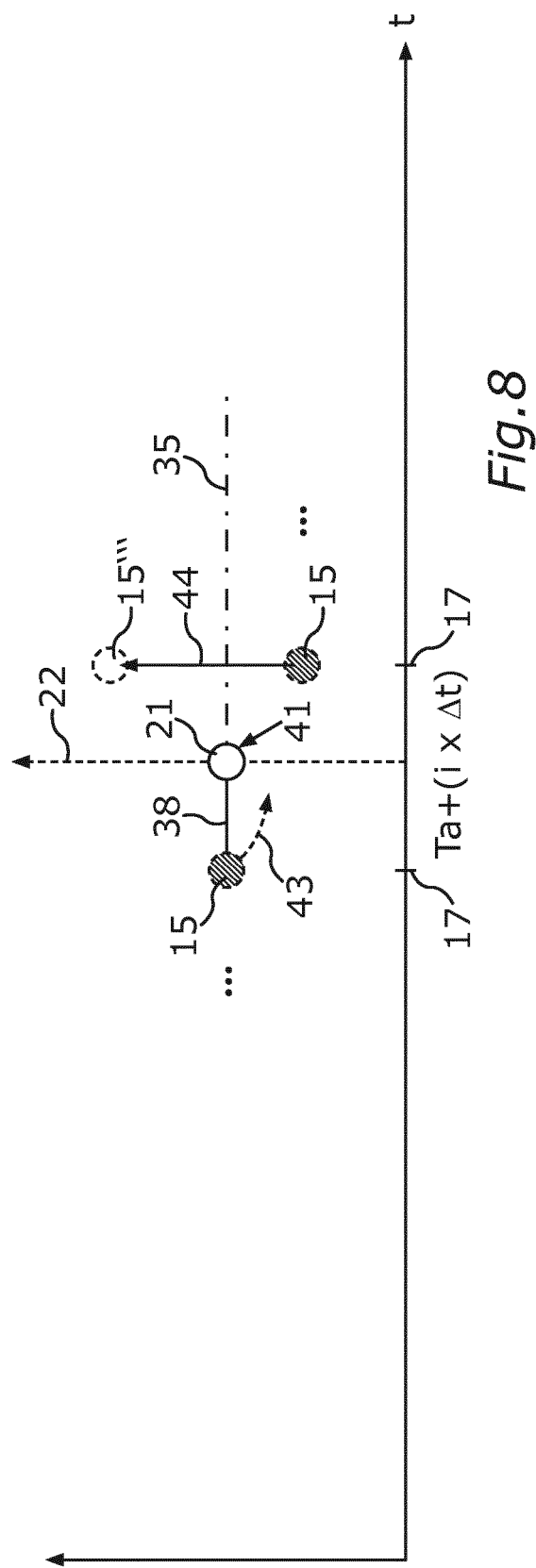

METHOD FOR AGGREGATING OPERATING VALUES OF A PLURALITY OF SPATIALLY DISTRIBUTED OPERATING UNITS, AND MONITORING DEVICE FOR CARRYING OUT THE METHOD

CROSS REFERENCE TO RELATED APPLICATIONS

This application is a continuation of PCT International Application No. PCT/EP2018/052598, filed Feb. 2, 2018, which claims priority under 35 U.S.C. § 119 from German Patent Application No. 10 2017 204 176.5, filed Mar. 14, 2017, the entire disclosures of which are herein expressly incorporated by reference.

BACKGROUND AND SUMMARY OF THE INVENTION

The invention relates to a method for aggregating operating values that describe the energy behavior of a multiplicity of spatially distributed operating units. The operating units may be, for example, units of an industrial installation or charging stations for electric vehicles. At least some of the operating units may be configured uniformly and/or at least some may be configured differently to one another. The invention also includes a monitoring apparatus by means of which the method according to the invention can be carried out.

The problem on which invention is based is explained here initially using the example of an industrial installation. In an industrial installation, a multiplicity of devices may be arranged in an area or region, each of said devices constituting an operating unit that can exchange electrical energy with an electrical supply system of the installation. An operating unit may in this case be an electrical consumer, for example an electric motor or a pump, or an electrical energy source, for example a photovoltaic installation or a hydroelectric power plant. An operating unit may also function alternately both as an electrical consumer and as an electrical energy source, such as, for example, an electrical storage battery or energy store.

In connection with the control of such operating units in the context of the industry standard "Industry 4.0" and also in connection with the networking of operating units to form a so-called "Internet of things" (IoT), provision is made for operating units to control the operation thereof autonomously or independently instead of being connected centrally by a control center. However, it is therefore difficult to ascertain what electrical power requirement (electrical consumer) and/or what electrical power capability (electrical energy source) overall the multiplicity of operating units has at a given time with respect to the supply system. To this end, electrical operating values of the operating units, for example the respective instantaneously consumed or generated electrical power, have to be combined, that is to say aggregated.

However, the described problem does not arise only in industrial installations. In connection with the invention, a multiplicity of spatially distributed operating units whose operating values are intended to be aggregated is generally assumed. Therefore, for example, a system of measurement points (for example electricity meters) or an installation composed of electrical charging stations for electric vehicles or hybrid vehicles may likewise constitute such an installation of operating units. Such charging stations are also not able to be controlled centrally when they output electrical power since this is dependent on when a driver connects his electric vehicle to a charging station. A multiplicity of households with electrical consumers and photovoltaic installations and/or heat pumps may also be considered to be an installation having a multiplicity of spatially distributed operating units. Therefore, some examples for a respective operating unit are given here for illustration: an electric machine (generator, motor), a charging station for an electric vehicle or hybrid vehicle, a photovoltaic installation, a hydroelectric power plant, a pumped-storage power plant, an electric vehicle connected to an electrical supply system (operated as an electrical consumer or as an electrical intermediate store), a domestic appliance, a building having electrical building wiring. These examples do not represent a conclusive list.

U.S. Pat. No. 7,243,044 B2 discloses the aggregation of operating data of public buildings or schools or hospitals. The operating data can indicate the consumed energy. An aggregation period can be prescribed for the aggregation.

To ascertain operating values of individual operating units of this kind, present measurement values can firstly be ascertained at the operating unit by means of a measurement unit or sensor unit. Said measurement values can then be received by a central monitoring apparatus and be aggregated with the measurement values of other operating units. Aggregation values that describe for the entirety or multiplicity of the operating units the overall behavior of the operating units in relation to an energy variable, such as, for example, the electrical power or thermal energy, that is to say, for example, the overall power, are thus obtained. In addition to a sensor unit, however, recourse can also be made to a database in which stored, historic measurement values may be stored. In the following text, a sensor unit and a database are each generally referred to as a data source.

If one wishes to know or ascertain an aggregation value of the operating units at a prescribed aggregation time, the problem that a measurement value is not available from each data source at the prescribed aggregation time may arise. To differentiate this problem more clearly, the values available from the data sources (sensor unit, database) are referred to as raw values in the following text. In contrast, the values required at the prescribed aggregation times are referred to as operating values. A raw value whose detection time corresponds to the prescribed aggregation time can thus be used as operating value.

US 2012/0290266 A1 discloses a data aggregation system by means of which measurement values are received from a multiplicity of different sensors, wherein each measurement value also comprises a detection time. The measurement values may be, for example, blood pressure values. To be able to aggregate the multiplicity of measurement values, the timestamp of the detection time is replaced in each case by a central system timestamp. As a result thereof, the measurement values of different sensors have the same timestamp and can therefore be aggregated in a time-synchronized manner. It is disadvantageous here that the process here is simply as if a measurement value were detected at a different time. This can lead to distorted aggregation values during aggregation.

A further problem can result from the fact that the proper functioning of the sensor units (for example energy meters) of the operating units cannot always be monitored because this can be too complex in terms of time and technology on account of said spatial distribution of the operating units. In addition, the transmission of raw values via a transmission path is likewise susceptible to faults. In the case of an energy meter, it may also arise that the signaled meter value has a jump or radical change due to an exchange of the meter because the new energy meter restarts the metering at zero. That is to say that, overall, signaling with gaps or faulty signaling of the electrical behavior of an individual operating unit may arise due to communication failures, reconfiguration or exchange of a sensor unit or due to a defect in a sensor unit. This should be recognized and taken into account during aggregation.

WO 2015/079554 A1 discloses the control of devices that are electrically coupled via an electrical supply system. Sensor units detect sensor data, which however, are not always available in a timely manner for control on account of delays in transmission.

The invention is based on the object of ascertaining aggregation values in a multiplicity of spatially distributed operating units, said aggregation values describing the operating behavior of all of the operating units.

The invention provides a method for aggregating operating values of a multiplicity of spatially distributed operating units.

The method can be carried out by a monitoring apparatus, which may be configured, for example, as a central computer. Aggregation times for the aggregation are prescribed in the described manner. An aggregation value is intended to be provided at each aggregation time such that a time series of aggregation values is produced. To this end, the monitoring apparatus initially provides an ideal state, which consists in said operating values that describe a sought operating variable at each of the aggregation times being ascertained for each of the operating units. The operating values are thus available in the prescribed time pattern of the aggregation times, that is to say in the aggregation cycle. Said operating variable may be, for example, an electric current or an electrical energy or an electrical power or thermal energy or thermal power, which the respective operating unit exchanges with a supply system. The operating variable may also be a medium exchanged with the supply system, for example a liquid (for example water) or a gas. "Exchange" in this case means both the draw (operation as consumer) and also infeed (operation as source). The supply system may accordingly comprise an electrical supply system and/or a district heating system and/or a gas system or a line system for a liquid. The method can generally be applied to energy media (for example current, heat) or other media (for example water) and energy carriers (for example natural gas or liquid fuel). The operating variable may describe a respective exchanged amount, for example an amount of energy or amount of power.

Because the operating values are present in the aggregation cycle, each aggregation value can be generated from time-synchronized operating values of the different operating units by means of a predetermined aggregation function for the purpose of aggregation. Time-synchronized operating values are operating values that describe the operating variable at a common aggregation time or at the same aggregation time. Said aggregation function can be freely prescribed by a person skilled in the art. Said aggregation function may be, for example, a summation or an average value formation.

The question is now how to arrive at the desired operating values for the aggregation times. Since in each case only the described raw values are received by the monitoring apparatus for each operating unit, said raw values describing the operating variable at a respective detection point that does not necessarily have to be identical to an aggregation time, such that it may arise that no matching raw value is present at a prescribed aggregation time. In addition, the raw values are not tested to determine whether they originate from a functioning or a defective sensor unit, wherein the latter leads, for example, to a time series of the sensor with gaps or erroneous data. A jump or a radical change in the time series of the raw values can also still be present in the raw values, for example, on account of a sensor exchange or a meter reset.

In order to now obtain meaningful aggregation values, the required operating values of at least one of the operating units are formed based on the raw values thereof as follows. Each operating unit can be treated individually here. With respect to the presently considered operating unit, it is possible to proceed individually in this case for each aggregation time, for which reason the present considered aggregation time is referred to in the following text as "present aggregation time". For the present aggregation time a "reliable" operating value is sought in each case by means of a predetermined checking function based on the raw values. The operating value is intended to be formed therefor depending on at least one of the raw values of the presently considered operating unit and should or must fulfill both a predetermined synchronicity criterion with respect to the present aggregation time and a predetermined plausibility criterion with respect to the operating value. "Searching" in this case means that the predetermined checking function is applied to the raw values and is tested to determine whether the checking function can actually generate or deliver a reliable operating value as a result. When a reliable operating value is found, this is used for the present aggregation time. It is therefore ensured that the operating value both exhibits synchronicity in the context of the synchronicity criterion in relation to the present aggregation time and is plausible within the context of the plausibility criterion in relation to the described operating variable. When there is no reliable operating value, that is to say when the checking function has not ascertained an operating value, in contrast a detection gap is signaled. This signals that no operating value is available for the present aggregation time for the presently considered operating unit.

The invention produces the advantage that the aggregation function is applied only to operating values for which the checking function is used to ensure that each operating value fulfils both the synchronicity criterion and the plausibility criterion. Aggregation values can thus be protected from the described impairments due to raw values with gaps or erroneous raw values.

The invention also includes advantageous developments whose features produce additional advantages.

If the checking function signals said detection gap (no operating value available), one of the following protective measures can be provided. The aggregation can be terminated. As a result thereof, only aggregation values up to that aggregation time at which a fault has arisen for the first time, that is to say there is no operating value or an operating value could not be ascertained, is provided. As an alternative thereto, a predetermined standard value or default value can be used as operating value. For example, such a default value can be 0. In the case of an aggregation function that provides a summation, there is therefore no influence on the missing operating value. As an alternative thereto, the aggregation time can be canceled. This ensures that the time series of the aggregation values indicates or comprises only aggregation times at which an operating value was able to be ascertained for each operating unit.

One development addresses the question of how the checking function can ascertain or calculate an operating value at the present aggregation time based on the raw values. If a raw value having a detection time that corresponds or is identical to the present aggregation time is present, this raw value can obviously be used. The synchronicity criterion is therefore fulfilled automatically. It then only remains to test whether said raw value fulfils the plausibility criterion as well. However, in the event that there is no raw value having an appropriate detection time, the checking function preferably generates the operating value by virtue of generating instead of a raw value an operating value from at least two of the raw values by means of a predetermined interpolation function or a predetermined extrapolation function. The checking function thus applies the interpolation function or extrapolation function and therefore generates an operating value for the present aggregation time. Interpolation means that the operating value is formed between at least two raw values. The one-sided continuation of the time series of the raw values produces in contrast an extrapolated operating value.

During interpolation/extrapolation, care must be taken that only those raw values that also have a prescribable or known time reference to the present aggregation time are taken as a basis. For example, a raw value that is several hours or days old being used for extrapolation must be prevented. The synchronicity criterion therefore preferably comprises that the operating value is formed or may be formed only from at least one such raw value whose respective detection time deviates from the respective present aggregation time at most by a predetermined tolerance value. This thus produces a tolerance interval around the present aggregation time, in which tolerance interval each raw value used must lie. Only raw values or a raw value from the tolerance interval may be used for the interpolation/extrapolation. If there is no such raw value, the synchronicity criterion is violated and there is thus no operating value and therefore a detection gap.

Several developments relate to the question of how the plausibility criterion can be configured.

One possible plausibility criterion comprises or prescribes that the operating value is formed or may be formed by the checking function only from at least one such raw value that that has a difference with respect to its respective temporally immediately previous raw value, said difference being smaller in terms of magnitude than a predetermined jump value or radical change value. A jump or radical change greater than the radical change value being present between two consecutive raw values is thus prevented. Such a jump can result, for example, due to the exchange of a meter with a new meter with a new meter state (for example 0) or due to the exchange of a sensor with a sensor of another sensor type.

To not have to terminate the aggregation in the presence of a radical change, that is to say to not have to signal a detection gap, in the event that there is no raw value or a raw value cannot be found that deviates from the preceding raw value at most by the radical change value, instead an artificial raw value can be calculated on the basis of a piece of information regarding a maximum power and the time difference or the time interval between two detection times, said artificial raw value having a maximum possible difference according to the maximum power from the temporally preceding raw value. A worst case consideration is thus carried out and ascertains what maximum energy difference (maximum power×time difference) can have resulted on the operating unit. Such an artificial raw value can then be used, for example, for the interpolation. In connection with an energy carrier, the maximum power constitutes a maximum performance (for example a maximum flow rate).

One development relates to the possibility of detecting or identifying the described meter exchange of an energy meter or electricity meter by means of the plausibility criterion. In this case, it is assumed that the operating variable is a cumulative variable, which increases exclusively monotonously. The time series of the raw values of said operating variable thus remain constant over time or becomes greater (is rising); there can be no drop or fall. Such a cumulative variable is, in particular, the consumed energy in the case of a consumer, for example an electrical consumer, or the generated energy in the case of a pure energy source, such as, for example, an electrical energy source, for example a photovoltaic installation. Another cumulative variable is thermal energy. For this case, the plausibility criterion preferably comprises that the operating value is formed only from such a raw value or only from such raw values that signal(s) a monotonous rise in the operating variable with respect to its respective temporally immediately preceding raw value. This is referred to in the following text as monotony condition. Thus, if the monotony condition is violated, this cannot describe the behavior of the pure consumer or the pure source. Therefore, a raw value that violates said monotony condition should not be taken into account in the formation of the present aggregation value.

If the monotony condition is violated because a meter, for example an energy meter, has been exchanged, this naturally affects all temporally subsequent raw values from the time of the exchange of the meter. Therefore, an aggregation over the time of the meter exchange would never be possible. To provide remedial action here, one development makes provision for, in the event that the at least one raw value for the present aggregation time signals a drop or fall (violation of the monotony condition), the raw value for which the fall has been identified and each temporally subsequent raw value are corrected to form a respective corrected raw value by means of an offset value. The offset value ensures the monotonous rise. The offset value may be, for example, the last meter state of the old, exchanged meter. If a new meter is used that begins to meter at 0, the time series of the raw values is therefore, by means of the offset value, continued where it was interrupted at the last meter state of the old, exchanged meter.

The raw values may be instantaneous values or average values. Instantaneous values mirror the instantaneous operating behavior (for example consumption or generation) of an operating unit, for example the energy operating behavior. An average value can be formed over a prescribed averaging interval, for example a period in the range of 10 seconds to a week. As a result, fluctuations during the exchange of energy during operation of the operating unit are combined on average so that the volatility of the time series of the aggregation values is reduced.

As already stated, the raw values of each operating unit are received in each case from at least one data source for the respective operating unit. It may be one data source that is involved or else a plurality of data sources, that is to say when it comes to, for example, an exchange of a data source with a new, other data source. The at least one data source can in this case comprise in the described manner a sensor unit for present raw values and/or at least one database for historic raw values. A sensor unit can have, for example, one sensor or a plurality of sensors and/or what is known as a smart energy meter and/or a meter (for example electricity meter or energy meter). A database acts as an input source for historic raw values, which may be stored, for example, in a data memory of the database.

To obtain raw values from the new data source as well when two data sources are exchanged, provision is made in the monitoring apparatus for said monitoring apparatus to switch over at least once between two data sources of one of the operating units. As a result thereof, the monitoring apparatus is then capable of furthermore receiving raw values but then from the new data source. It is thus possible to change at least once from a first sensor unit to a second sensor unit that replaces the first sensor unit, that is to say, for example, between two meters. In addition or as an alternative thereto, it is possible to change at least once between a database and a sensor unit. As a result thereof, a time series of raw values can be formed that comprises both historic raw values and present raw values The monitoring device is able to be used in a very flexible manner in the described way. The raw values can be received from operating units of an industrial installation (for example according to the standard "Industry 4.0") and/or an Internet of things (IoT) and/or a network of charging stations for electric vehicles or hybrid vehicles and/or a network of measurement points. A measurement point may be formed, for example, by an electricity meter or gas meter or flow rate meter, which may be provided, for example, for a household. In general, a measurement point is used for measurements relevant to billing.

If the aggregation values are then present, the overall behavior is thus known in relation to the underlying operating behavior, that is to say, for example, the overall demand or the overall power capacity of the operating units. Therefore, an operation of one or some or all of the operating units can therefore be coordinated with a respective operation of the respective other operating units depending on the aggregation values. If, for example, there is a lack of power, an operating unit that acts as an energy source can be activated or actuated. For example, a pumped-storage power plant can thus be connected. In addition or alternatively, a power profile of the operating units can be predicted or forecast based on the aggregation values. As a result thereof, a future power demand or a future power capacity, in each case described by the power profile, can be signaled, for example, to the operator of said supply system to which the operating units can be connected. As a result thereof, the system operator can adjust or match, for example, a power plant operation to the power profile.

To be able to carry out the method according to the invention, the invention provides said monitoring apparatus. Said monitoring apparatus serves to monitor the operating values of a multiplicity of spatially distributed operating units. The monitoring apparatus has a computation device, which is configured to carry out an embodiment of the method according to the invention. Said computation device can be designed based on at least one microprocessor or at least one microcontroller.

Further features of the invention emerge from the claims, the figures and the description of the figures. The features and combinations of features cited above in the description and the features and combinations of features cited below in the description of the figures and/or shown on their own in the figures are able to be used not only in the respectively specified combination but also in other combinations or else on their own.

The following text describes an exemplary embodiment of the invention. In this respect:

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 4 shows a graph for illustrating an interpolation and a synchronicity criterion.

FIG. 5 shows a graph for illustrating an extrapolation.

FIG. 6 shows a graph for illustrating a plausibility criterion.

FIG. 7 shows a graph for illustrating the plausibility criterion in connection with an interpolation.

FIG. 8 shows a graph for illustrating a monotony condition of a plausibility criterion.

DETAILED DESCRIPTION OF THE DRAWINGS

Figure 1:
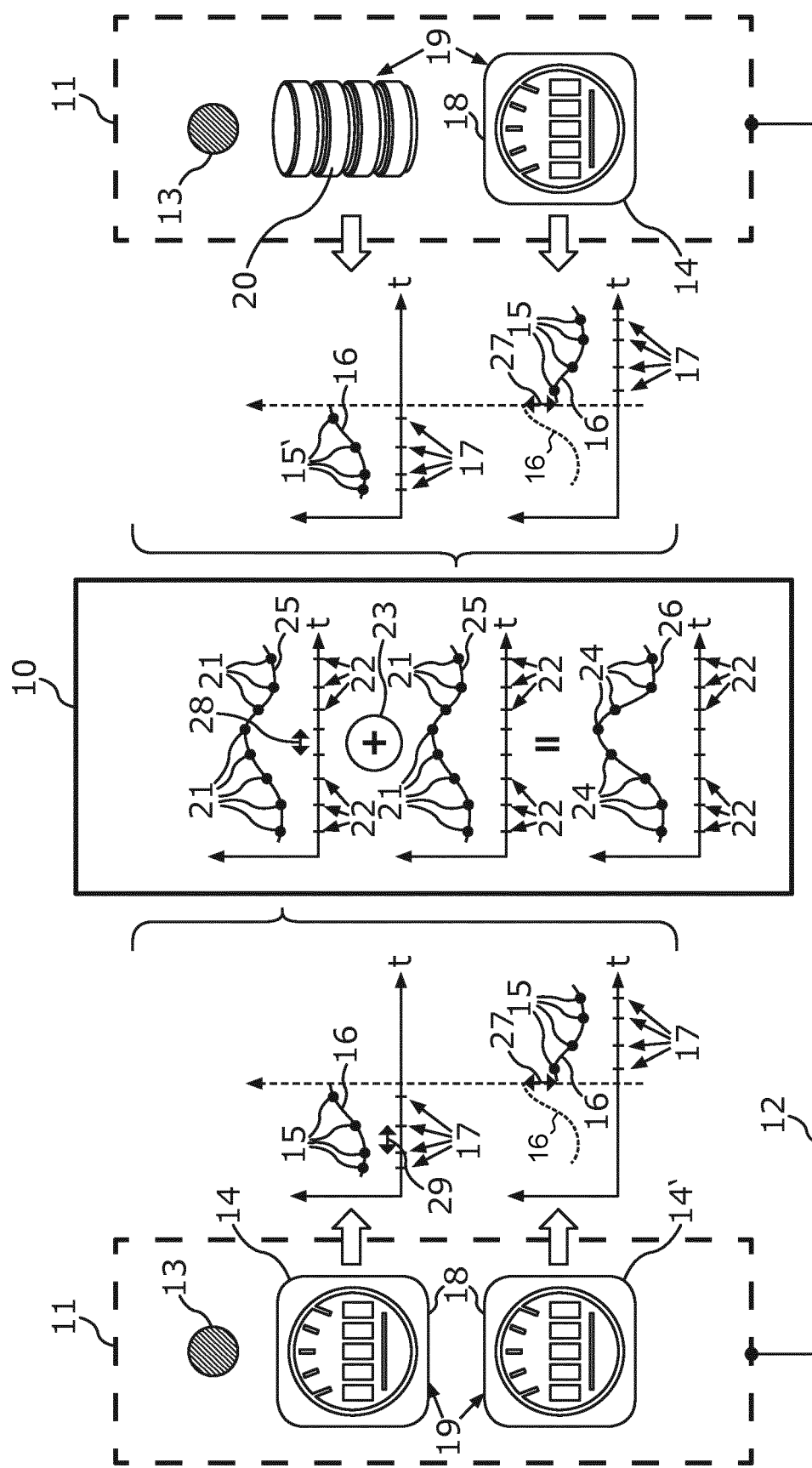
FIG. 1 shows a schematic illustration of an embodiment of the monitoring apparatus according to the invention having operating units coupled thereto.

FIG. 1 shows a monitoring apparatus 10, which may be, for example, a central computer of an industrial installation or a control center. Operating units 11 can be coupled to the monitoring apparatus 10. An operating unit 11 may be in the described manner an electrical consumer or an electrical energy source or else a device that may alternately be an electrical consumer and energy source. However, an operating unit may also be another energy consumer, for example a heating furnace for gas, or another medium consumer, for example a water consumer, and/or another energy source, for example a biogas plant or natural gas source, and/or another medium source, for example a water source. In the following text, it is assumed for the sake of clarity that electrical variables are taken as a basis.

The operating units 11 can be connected to an electrical supply system 12, with which each operating unit 11 can exchange electrical energy or electrical power. To detect the electrical power exchanged, a measurement point 13 can be provided at each operating unit 11, at which measurement point raw values 15 of an electrical variable, for example the electrical energy or power exchanged, can be detected by means of a meter 14 over time t. The raw values 15 belonging to a measurement point in each case constitute a time series 16. Each time series 16 describes at a respective detection time 17 of the respective raw value 15 the present raw value of the electrical variable applicable for this detection time 17. A detection time 17 can be signaled, for example, by a timestamp of the raw value. The illustrated meters 14 represent in each case a sensor unit 18. Such a sensor unit 18 is generally a data source 19. Another type of data source 19 may be a database 20. Historic or stored raw values 15' can be provided for respective detection times 17 from said database 20. The raw values 15, 15' can be transmitted to the monitoring apparatus 10. The monitoring apparatus 10 can be coupled to the operating units 11 for this purpose, for example via at least one communication network, for example the Internet and/or a mobile radio network.

Operating values 21, by way of which the described electrical operating variable is given in each case not at the detection times 17 but at prescribed aggregation times 22, can be ascertained for each operating unit 11 in each case from the raw values 15 by way of the monitoring apparatus 10. For the sake of clarity, only some of the aggregation times 23 are provided with a reference sign in the figure. The time-synchronized operating values 21 of the operating units 11 can then be combined easily to form aggregation values 24 by means of an aggregation function 23, for example a summation. In other words, the time series 25 of the operating values 21 of the different operating units 11 can be combined to form a time series 26 of aggregation values 24 by means of the aggregation function 23.

The aggregation values 24 are intended to describe the electrical behavior of the operating units 11 overall, for example with respect to the supply system 12. In this case, the described distortions due to erroneous raw values 15, 15' can arise, but these are prevented by the monitoring apparatus 10 in the following manner.

One possibility for a distortion or an error consists in the meter 14 being able to be replaced with a new meter 14' in an operating unit 11. That is to say the respective time series 16 that are received from the respective raw values 15 of the old meter 14 and of the new meter 14' by the monitoring apparatus 10 can exhibit a jump or radical change 27. Likewise, a radical change 27 can result during a changeover from the database 20 to a meter 14 between the historic raw values 15' and the measured raw values 15. However, a radical change 27 does not reflect the electrical behavior of the operating units 11 themselves and must therefore be compensated in the time series 25 of the operating values 21.

A further problem can consist in that an appropriate detection time 17 with a raw value 15, 15' does not necessarily have to be present at the prescribed aggregation times 22. In addition, a clock or a time interval 28 between the aggregation times 22 may be different from a time interval 29 of the detection times 17. For example, raw values 15 at a time interval of, for example, 1 second or generally in a range of from 1 second to 1 hour can be generated by a meter 14. Provision may be made for aggregation values 22 with a time interval 28 of, for example, 25 seconds or generally at an interval of 1 second to one day to be ascertained. In this case, appropriate raw values 15 then have to be found or ascertained to form the respective operating value 21 required at an aggregation time 22.

Figure 2:
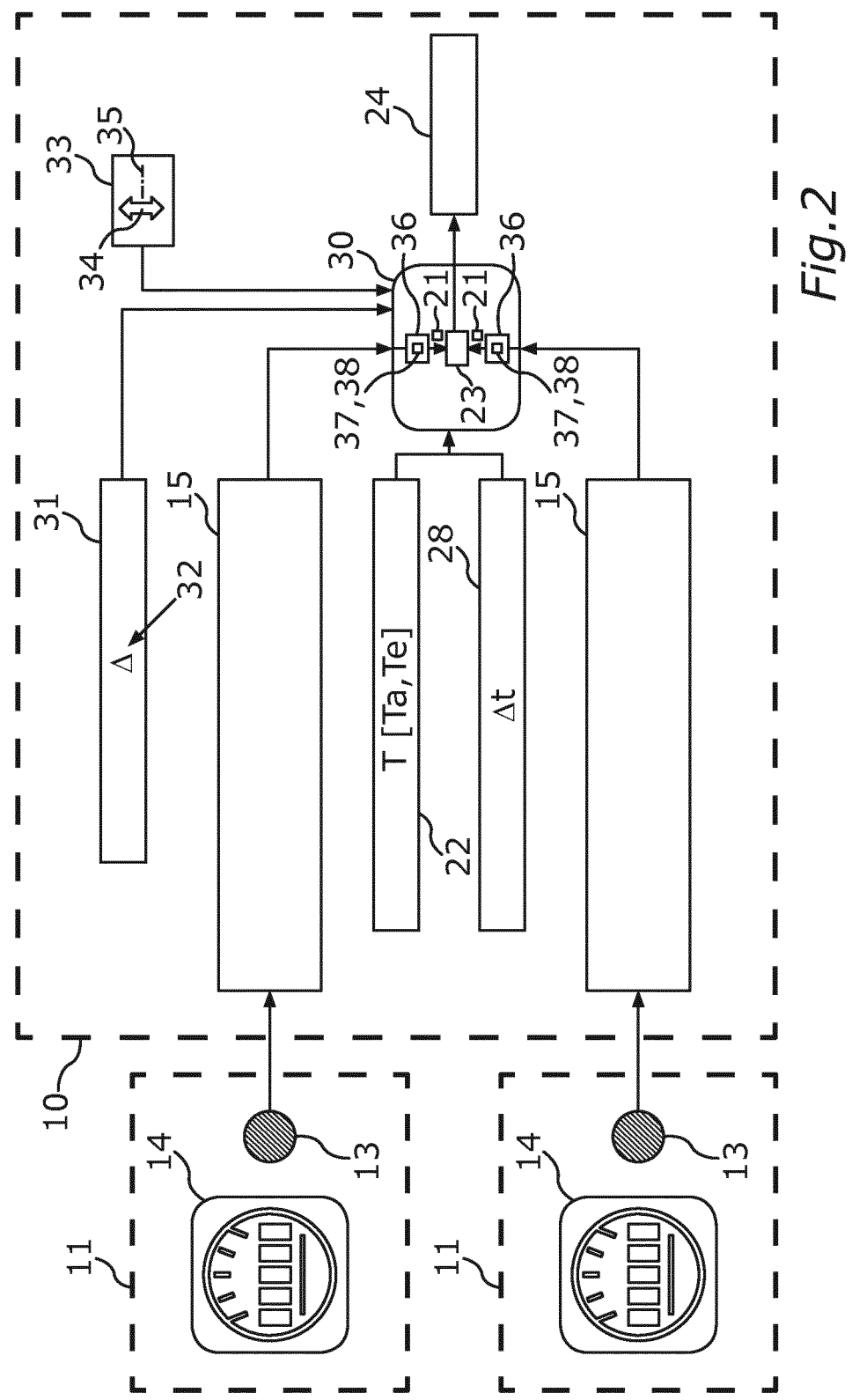
FIG. 2 shows a schematic illustration of the monitoring apparatus having an aggregation unit provided therein.

FIG. 2 illustrates the monitoring apparatus 10 one more with components. The monitoring apparatus 10 can have a computation device 30, which can carry out the aggregation by means of the aggregation function 23. The computation device 30 can receive the raw values 15 of the operating units 14. The prescribed aggregation times 22 form overall a time interval from a start time Ta to an end time Te, wherein the time interval 28 can be prescribed as a value $\Delta t$ and wherein, in particular, the overall period or aggregation time T divided by the time interval 28 produces a natural number (T/$\Delta t$=natural number). A synchronicity criterion 31 can be prescribed, which indicates a tolerance value 32 ($\Delta$). In addition, a plausibility criterion 33 with a radical change value 34 and a monotony condition 35 can be prescribed. The synchronicity criterion 31 and the plausibility criterion 33 are explained in more detail in the following text.

The respective operating values 21 can be ascertained by means of a checking function 36 for each operating unit 11 based on the received raw values 15, 15'. If no appropriate raw value 15 with an appropriate detection time 17 is available for a prescribed aggregation time 22, an operating value 21 for the aggregation time 22 can be ascertained by means of a prescribed interpolation function 37 or a prescribed extrapolation function 38. The aggregation values 24 can then be generated by means of the aggregation function 23 in the described manner.

Figure 3:
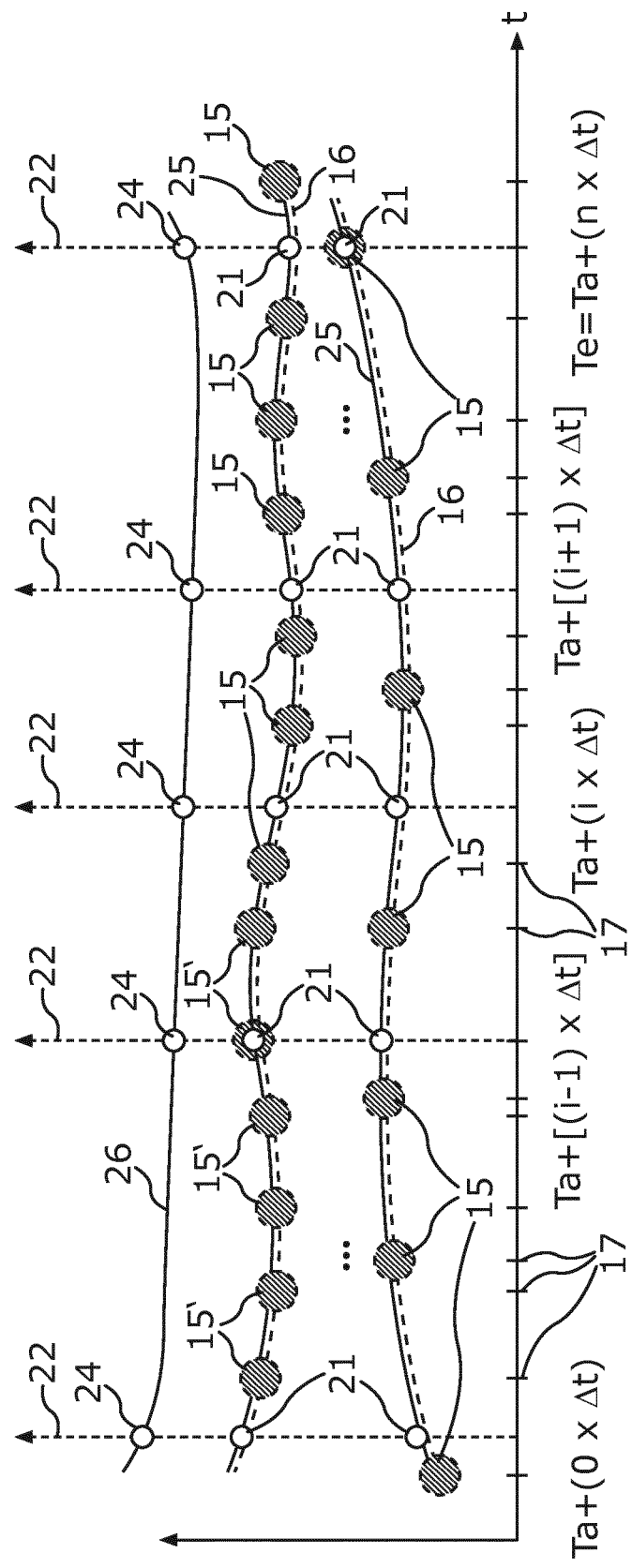
FIG. 3 shows a graph having schematized profiles of time series.

FIG. 3 again illustrates the relationship between the time series 16 of the raw values 15, 15', the time series 25 of the operating values 21 and the time series 26 of the aggregation values 24. How the aggregation times 22 can also differ from the detection times 17 is illustrated. The aggregation times 22 can be produced in each case from Ta+(i×$\Delta t$), wherein i is a meter value from 0 to n.

The following descriptions also relate to historic raw values 15' since the reference sign for raw values 15 from sensor units 18 is used only for the sake of clarity.

FIG. 4 illustrates how an operating value 21 can be ascertained at a prescribed present aggregation time 22 by means of the interpolation function 37 between two raw values 15. The synchronicity criterion 31 can prescribe here that only raw values 15 within a tolerance interval 39 should be used, said tolerance interval extending in each case with respect to the aggregation time 22 about the tolerance value 32 into the future and into the past. If the interpolation function 37 is a linear interpolation, the closest raw values 15 can be used. If two raw values lie within the tolerance interval 39, as illustrated in FIG. 4, an operating value 21 that describes the electrical operating variable at the aggregation time 22 can be calculated by means of the interpolation function 37, as the interpolation function 37 produces.

FIG. 5 illustrates the case that only one raw value 15 lies within the tolerance interval 39. The operating value 21 can now be ascertained by means of the extrapolation function 38. As an alternative thereto, a default value 41 can also be used. Provision may also be made for the aggregation to be terminated at the aggregation time 22 or for the aggregation time 22 to be canceled.

FIG. 6 illustrates a case in which, although a raw value 15 with a detection time 17 that corresponds to the aggregation time 22 is present, there is a radical change 27 between the raw value 15 at the aggregation time 22 and the preceding raw value 15 at the preceding or last detection time 17. The radical change 27 constitutes the difference between the two raw values 15. If said radical change 27 is greater than the radical change value 34 the plausibility criterion 33 is violated as a result thereof. It is possible for an operating value 21 to be calculated by virtue of initially an artificial raw value 15" being calculated based on the time interval 29 between the detection times 17 and based on a value for a maximum power 42, said artificial raw value being produced if the operating unit 11 generates or outputs or consumes the maximum power 42 for the time spacing of the time interval 29. Since the artificial raw value 15" is produced directly at the aggregation time 22, the artificial raw value 15" can be used as operating value 21.

FIG. 7 illustrates the case of FIG. 6, wherein, however, only raw values that do not correspond to the aggregation time 22 are present at detection times 17. The radical change 27 is again greater than the radical change value 34. An operating value 21 for the aggregation time 22 can now be ascertained based on the artificial raw value 15" and by means of the interpolation function 37.

FIG. 8 illustrates a case in which a sequence of two raw values 15 signals a drop or fall 43 in the time series 16 of the raw values 15. This cannot be the case, for example, with raw values 15 that describe an electrical energy as electrical operating variable. However, this is identified based on the monotony condition 35, which indicates that a subsequent raw value 15 must be greater than or equal to the preceding raw value 15. If the monotony condition 35 is not fulfilled, the plausibility criterion 33 is violated. The checking function 36 can now form the operating value 21, for example, by means of the extrapolation function 38. As an alternative thereto, the preceding raw value 15 can also simply be continued as extrapolation or the aggregation can be terminated or a default value 41 can be used or a corrected raw value 15''' can be generated by means of an offset value 44, by means of which the monotony condition 35 is fulfilled again.

Overall, the example shows how a system for processing energy data and measurement values can be provided by the invention.

LIST OF REFERENCE SIGNS

10 Monitoring apparatus
11 Operating unit
12 Supply system
13 Measurement point
14 Meter
14' New meter
15 Operating value
15' Historic raw value
15'' Artificial raw value
15''' Corrected raw value
16 Time series
17 Detection time
18 Sensor unit
19 Data source
20 Database
21 Operating value
22 Aggregation time
23 Aggregation function
24 Aggregation value
25 Time series
26 Time series
27 Radical change
28 Time interval
29 Time interval
30 Computation device
31 Synchronicity criterion
32 Tolerance value
33 Plausibility criterion
34 Radical change value
35 Monotony condition
36 Checking function
37 Interpolation
38 Extrapolation
39 Tolerance interval
41 Default value
42 Maximum power
43 Drop
44 Offset value The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for aggregating operating values of a plurality of spatially distributed operating units, wherein, by way of a monitoring apparatus:

predefining an aggregation clock composed of consecutive aggregation times,
wherein the respective operating values of each of the plurality of spatially distributed operating units describe an operating variable of a respective one of the plurality of spatially distributed operating units at each of the respective consecutive aggregation times;

generating a respective aggregation value from respective time-synchronized operating values of the plurality of spatially distributed operating units using a predetermined aggregation function for aggregation of the operating values of the plurality of spatially distributed operating units;

receiving respective raw values for each plurality of spatially distributed operating units, wherein the raw values respectively describe the operating variable at a respective detection time,
wherein the operating values of at least one of the plurality of spatially distributed operating units are formed based on respective raw values of such operating values by virtue of, for each of the consecutive aggregation times, in each case based on a predetermined checking function depending on at least one of the raw values, searching for an operating value that satisfies both a predetermined synchronicity criterion with respect to a present aggregation time of the aggregation clock and a predetermined plausibility criterion with respect to such operating variable, wherein, in the event that there is no raw value whose detection time corresponds to the present aggregation time, the operating values are nevertheless present in the aggregation clock by virtue of the predetermined checking function generating the respective operating value from at least two of said raw values based on either a predetermined interpolation function or on a predetermined extrapolation function, whereby the predetermined checking function tests the predetermined plausibility criterion, if the sought operating value is found, the method comprises using said operating value for the present aggregation time; and if the sought operating value is not found, the method comprises signaling a detection gap, wherein, when the detection gap is signaled, the aggregation is terminated or a predetermined default value is used as the operating value or the aggregation time is canceled.

2. The method according to claim 1, wherein the predetermined synchronicity criterion comprises that the respective operating value is formed only from at least one such raw value whose respective detection time deviates from the respective present aggregation time at most by a predetermined tolerance value.

3. The method according to claim 1, wherein the predetermined plausibility criterion comprises that the respective operating value is formed only from at least one such raw value that has a difference with respect to its respective temporally immediately previous raw value, said difference being smaller in terms of magnitude than a predetermined radical change value.

4. The method according to claim 2, wherein the predetermined plausibility criterion comprises that the respective operating value is formed only from at least one such raw value that has a difference with respect to its respective temporally immediately previous raw value, said difference being smaller in terms of magnitude than a predetermined radical change value.

5. The method according to claim 3, wherein, in the event that there is no raw value that deviates from the temporally immediately preceding raw value in terms of magnitude at most by the predetermined radical change value, the method further comprises calculating an artificial raw value based on information regarding a maximum power and a time interval between two immediately consecutive detection times, said artificial raw value having a maximum possible difference according to the maximum power from the temporally preceding raw value.

6. The method according to claim 4, wherein, in the event that there is no raw value that deviates from the temporally immediately preceding raw value in terms of magnitude at most by the predetermined radical change value, the method further comprises calculating an artificial raw value based on information regarding a maximum power and a time interval between two immediately consecutive detection times, said artificial raw value having a maximum possible difference according to the maximum power from the temporally preceding raw value.

7. The method according to claim 1, wherein the operating variable is a cumulative variable, which increases exclusively monotonously, and the predetermined plausibility criterion comprises that the operating value is formed only from at least one such raw value that signals a monotonous rise in the operating variable with respect to its respective temporally immediately preceding raw value.

8. The method according to claim 5, wherein, in the event that a raw value for the present aggregation time signals a drop in the operating variable, the raw value and each temporally subsequent raw value are corrected to form a respective corrected raw value by using an offset value, by which the monotonous rise is ensured.

9. The method according to claim 1, wherein the operating variable is an electric current or an electrical energy or an electrical power, which the respective operating unit has exchanged with an electrical supply system and/or wherein the raw values are instantaneous values or average values.

10. The method according to claim 1, wherein the raw values of each of the plurality of spatially distributed operating units are respectively received from at least one data source for a respective one of the plurality of spatially distributed operating units, and the at least one data source comprises at least one sensor unit for present raw values and/or at least one database for historic raw values.

11. The method according to claim 2, wherein the raw values of each of the plurality of spatially distributed operating units are respectively received from at least one data source for a respective one of the plurality of spatially distributed operating units, and the at least one data source comprises at least one sensor unit for present raw values and/or at least one database for historic raw values.

12. The method according to claim 3, wherein the raw values of each of the plurality of spatially distributed operating units are respectively received from at least one data source for a respective one of the plurality of spatially distributed operating units, and the at least one data source comprises at least one sensor unit for present raw values and/or at least one database for historic raw values.

13. The method according to claim 10, wherein a changeover is made at least once between two data sources of one of the plurality of spatially distributed operating units.

14. The method according to claim 13, wherein a change is made at least once from a first sensor unit to a second sensor unit that replaces the first sensor unit and/or wherein a change is made at least once between a database and a sensor unit.

15. The method according to claim 1, wherein the raw values are received from the plurality of spatially distributed operating units of an industrial installation and/or an Internet of things and/or a network of charging stations for electric vehicles or hybrid vehicles and/or a network of measurement points.

16. The method according to claim 1, wherein an operation of one or more of the plurality of spatially distributed operating units is coordinated with respective operation of a respective other one of the plurality of spatially distributed operating units and/or a power profile of the plurality of spatially distributed operating units is predicted depending on the aggregation values.

17. A monitoring apparatus for monitoring operating values of a plurality of spatially distributed operating units, the monitoring apparatus comprising:
 characterized in that
 a computation device configured to:
 predefine an aggregation clock composed of consecutive aggregation times,
  wherein the respective operating values of each of the plurality of spatially distributed operating units describe an operating variable of a respective one of the plurality of spatially distributed operating units at each of the respective consecutive aggregation times;
 generate a respective aggregation value from respective time-synchronized operating values of the plurality of spatially distributed operating units using a predetermined aggregation function for aggregation of the operating values of the plurality of spatially distributed operating units;
 receive respective raw values for each plurality of spatially distributed operating units, wherein the raw values respectively describe the operating variable at a respective detection time,
  wherein the operating values of at least one of the plurality of spatially distributed operating units are formed based on respective raw values of such operating values by virtue of, for each of the consecutive aggregation times, in each case based on a predetermined checking function depending on at least one of the raw values,
 search for an operating value that satisfies both a predetermined synchronicity criterion with respect to a present aggregation time of the aggregation clock and a predetermined plausibility criterion with respect to such operating variable,
 wherein, in the event that there is no raw value whose detection time corresponds to the present aggregation time, the operating values are nevertheless present in the aggregation clock by virtue of the predetermined checking function generating the respective operating value from at least two of said raw values based on either a predetermined interpolation function or on a predetermined extrapolation function, whereby the predetermined checking function tests the predetermined plausibility criterion,
 if the sought operating value is found, the computation device is configured to use said operating value for the present aggregation time; and
 if the sought operating value is not found, the computation device is configured to signal a detection gap, wherein, when the detection gap is signaled, the aggregation is terminated or a predetermined default value is used as the operating value or the aggregation time is canceled.

* * * * *